(12) United States Patent
Mizuno et al.

(10) Patent No.: US 8,937,569 B2
(45) Date of Patent: Jan. 20, 2015

(54) ANALOG-TO-DIGITAL CONVERSION DEVICE

(71) Applicant: Fujitsu Semiconductor Limited, Yokohama (JP)

(72) Inventors: Yasuhiro Mizuno, Yokohama (JP); Sadayoshi Umeda, Ome (JP); Zongyang Xue, Yokohama (JP); Tomoharu Watanabe, Setagaya (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/767,621

(22) Filed: Feb. 14, 2013

(65) Prior Publication Data

US 2013/0214957 A1 Aug. 22, 2013

(30) Foreign Application Priority Data

Feb. 16, 2012 (JP) ................................. 2012-031770

(51) Int. Cl.
*H03M 1/08* (2006.01)
*H03M 1/18* (2006.01)

(52) U.S. Cl.
CPC ............ *H03M 1/0845* (2013.01); *H03M 1/182* (2013.01)
USPC ............................ 341/155; 341/139; 327/538

(58) Field of Classification Search
CPC .... H03M 1/0845; H03M 1/181; H03M 1/182
USPC ......................................... 341/155; 327/538
See application file for complete search history.

(56) References Cited

U.S. PATENT DOCUMENTS

| | | | | |
|---|---|---|---|---|
| 5,034,745 | A * | 7/1991 | Kelly | 341/155 |
| 5,790,061 | A * | 8/1998 | Norimatsu | 341/139 |
| 6,057,729 | A | 5/2000 | Nomura | |
| 6,275,259 | B1 * | 8/2001 | Gowda et al. | 341/139 |
| 6,600,434 | B2 * | 7/2003 | Ko et al. | 341/120 |
| 7,030,791 | B2 * | 4/2006 | Harada | 341/155 |
| 7,915,952 | B2 * | 3/2011 | Murakami | 327/558 |
| 8,618,869 | B2 * | 12/2013 | Dettloff et al. | 327/538 |
| 2007/0195483 | A1 * | 8/2007 | Asano | 361/272 |
| 2009/0008992 | A1 * | 1/2009 | Murakami | 307/11 |
| 2009/0091370 | A1 | 4/2009 | Kawasaki | |
| 2010/0272278 | A1 * | 10/2010 | Joho et al. | 381/71.6 |

FOREIGN PATENT DOCUMENTS

| | | |
|---|---|---|
| JP | 11-7330 A | 1/1999 |
| JP | 2009-094133 A | 4/2009 |

* cited by examiner

*Primary Examiner* — Howard Williams
(74) *Attorney, Agent, or Firm* — Arent Fox LLP

(57) ABSTRACT

An analog-to-digital conversion device has: an analog-to-digital converter configured to receive an input signal via an input signal node, and convert the input signal to a digital signal; and a control circuit configured to receive the digital signal when the input signal is set to have a fixed value, and change, when a deviation amount of the digital signal with the respect to an expected value is equal to or larger than a threshold value, a value of a capacitor between a power supply potential node and a reference potential node of the analog-to-digital converter and/or values of resistors connected to the power supply potential node and the reference potential node of the analog-to-digital converter.

12 Claims, 5 Drawing Sheets

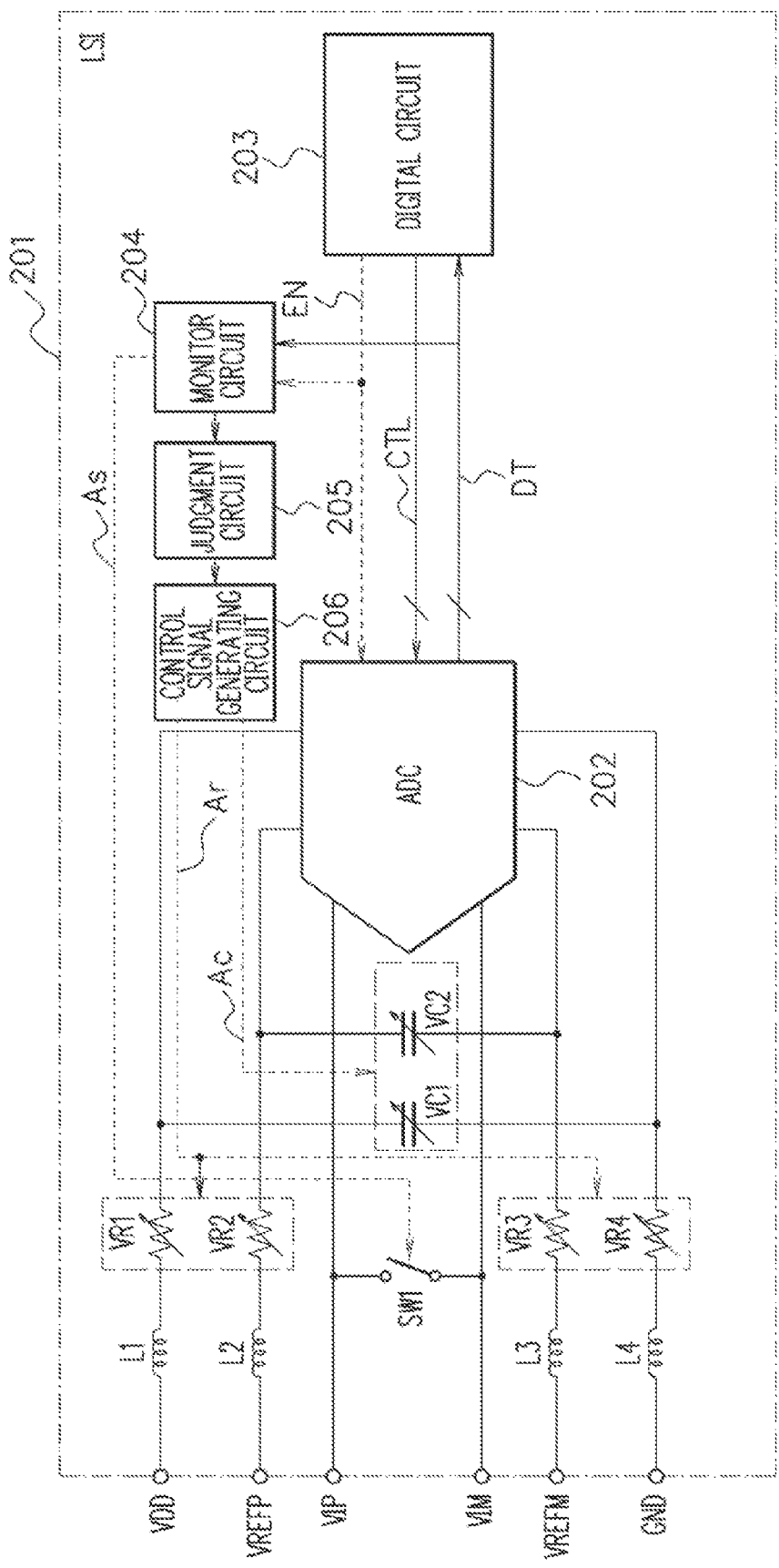
F I G. 2

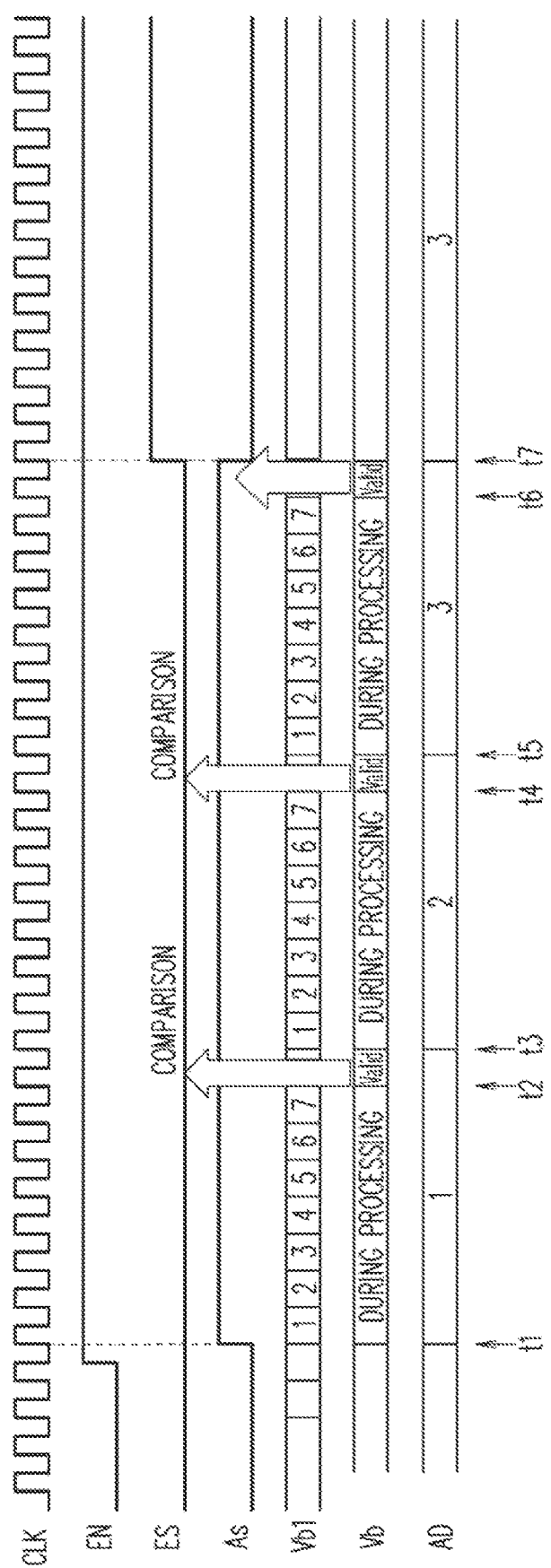

> US 8,937,569 B2

ANALOG-TO-DIGITAL CONVERSION DEVICE

CROSS-REFERENCE TO RELATED APPLICATION

This application is based upon and claims the benefit of priority of the prior Japanese Patent Application No. 2012-031770, filed on Feb. 16, 2012, the entire contents of which are incorporated herein by reference.

FIELD

The embodiment discussed herein is directed to an analog-to-digital conversion device.

BACKGROUND

An analog-to-digital converter is widely used for digitizing an analog signal, and is mainly used in a configuration of a semiconductor integrated circuit. Along with the development of manufacturing technique and microfabrication of semiconductor integrated circuit, a reduction in power supply voltage, an enhancement of speed, and an improvement of power efficiency are in progress. In a high-speed analog-to-digital converter, there is a problem that a noise generated when a switch included in the analog-to-digital converter is switched at high speed causes a variation in an electric potential of a node of power supply voltage or an electric potential of another node, resulting in that a conversion performance of the analog-to-digital converter itself is deteriorated.

A power supply circuit in an integrated circuit chip having a plurality of operating frequency modes in which a resonance point determined by a resistance, an inductance, and a capacitance parasitic on a power supply system is changed in accordance with an operating frequency signal, has been known (refer to Patent Document 1, for example).

Further, there has been known a semiconductor integrated circuit having a circuit executing predetermined processing, and a switch circuit switching a source impedance, in which the switch circuit switches the source impedance to make a resonance frequency of the semiconductor integrated circuit to be deviated from an operating frequency of the circuit in accordance with a variation in electric potential applied to the circuit (refer to Patent Document 2, for example).

[Patent Document 1] Japanese Laid-open Patent Publication No. 11-7330
[Patent Document 2] Japanese Laid-open Patent Publication No. 2009-94133

SUMMARY

An analog-to-digital conversion device has: an analog-to-digital converter configured to receive an input signal via an input signal node, and convert the input signal to a digital signal; and a control circuit configured to receive the digital signal when the input signal is set to have a fixed value, and changing, when a deviation amount of the digital signal with respect to an expected value is equal to or larger than a threshold value, a value of a capacitor between a power supply potential node and a reference potential node of the analog-to-digital converter and/or values of resistors connected to the power supply potential node and the reference potential node of the analog-to-digital converter.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is a diagram illustrating a configuration example of as analog-to-digital conversion device according to an embodiment;
FIG. 5 is a timing chart illustrating an example of operation of the circuits in FIG. 4.

DESCRIPTION OF EMBODIMENTS

Figure 1:
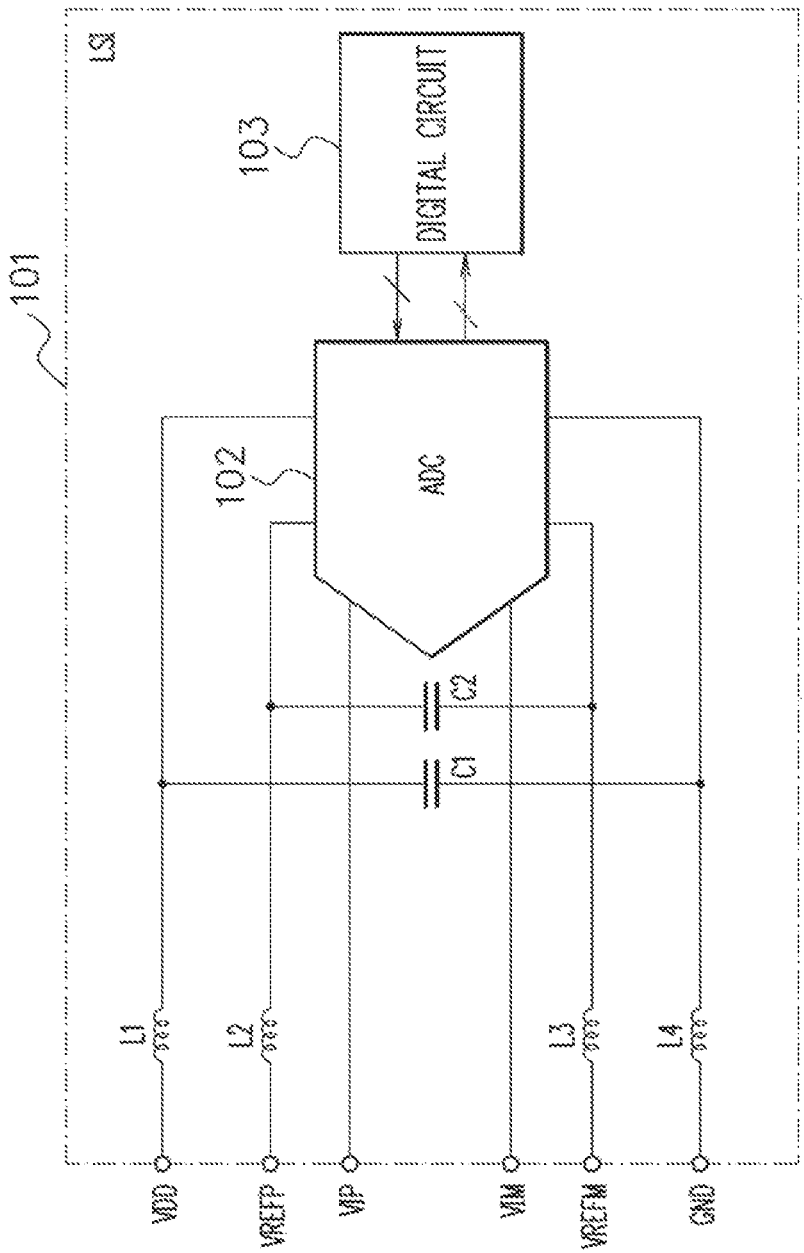
FIG. 1 is a diagram illustrating a configuration example of an analog-to-digital conversion device.

FIG. 1 is a diagram illustrating a configuration example of an analog-to-digital conversion device. An analog-to-digital conversion device 101 is a large scale integration (LSI), and has a power supply potential node VDD, a reference potential node GND, a first reference potential node VREFP, a second reference potential node VREFM, a first input signal node VIP and a second input signal node VIM. The power supply potential node VDD supplies a power supply potential from an outside to analog-to-digital converter 102. The reference potential node GND supplies a reference potential from an outside (ground potential, for example) to the analog-to-digital converter 102. The first reference potential node VREFP and the second reference potential node VREFM supply reference potentials for defining a full scale of the analog-to-digital converter 102 to the analog-to-digital converter 102. The first reference potential node VREFP is a reference potential node on a plus side, and the second reference potential node VREFM is a reference potential node on a minus side. To the first input signal node VIP and the second input signal node VIM, differential signals are input, for example. The first input signal node VIP is an input signal node on a plus side, and the second input signal node VIM is an input signal node on a minus side. The analog-to-digital converter 102 converts a signal of the first input signal node VIP and the second input signal node VIM from analog to digital, and outputs a digital signal to a digital circuit 103. The digital circuit 103 outputs a control signal such as a clock signal to the analog-to-digital converter 102.

When a switch included in the analog-to-digital converter 102 is switched at high speed, a noise is generated, and the noise causes a variation in electric potentials of the power supply potential node VDD, the reference potential node GND, the first reference potential node VREFP and the second reference potential node VREFM, resulting in that an analog-to-digital conversion performance of the analog-to-digital converter 102 is deteriorated.

In order to reduce the noise, capacitors C1 and C2 called as decoupling capacitors are provided. The capacitor C1 is connected between the power supply potential node VDD and the reference potential node GND. The capacitor C2 is connected between the first reference potential node VREFP and the second reference potential node VREFM. The capacitors C1 and C2 operate to supply an amount of sudden current change needed by the above-described switching operation from electric charges stored in the capacitors C1 and C2. The capacitor C1 can reduce the noise on the power supply potential node VDD and the reference potential node GND. The capacitor C2 can reduce the noise on the first reference potential node VREFP and the second reference potential node VREFM. It is desirable to use the capacitors C1 and C2 which can supply electric charges at high speed. Further, the larger the capacitance values of the capacitors C1 and C2 are, the more the noise can be reduced. Further, it is desirable to dispose the capacitors C1 and C2 in the vicinity of the analog-to-digital converter 102 being a source of the noise. In order to realize that, it is preferable to dispose the capacitors C1 and C2 in the large scale integration of the analog-to-digital conversion device 101.

The large scale integration of the analog-to-digital conversion device 101 is mounted on a package through wire bonding or the like. Inductors L1 to L4 are parasitic inductances due to a connection with the package, and are, for example, parasitic inductors due to a bonding wire or the like tor connecting a silicon substrate of the analog-to-digital conversion device 101 and an external circuit. The inductor L1 is a parasitic inductor connected to the power supply potential node VDD. The inductor L2 is a parasitic inductor connected to the first reference potential node VREFM. The inductor L3 is a parasitic inductor connected to the second reference potential node VREFM. The inductor L4 is a parasitic inductor connected to the reference potential node GND.

The capacitors C1 and C2 are provided on a semiconductor chip of the analog-to-digital conversion device 101 for stabilizing the power supply potential and the reference potential. However, since the capacitors C1 and C2 are configured to be connected in series to the inductors L1 to L4, there is a case where a resonance occurs. A resonance frequency is determined by values of the capacitors C1 and C2 and the inductors L1 to L4. In particular, when the resonance frequency is close to an operating frequency or a signal band of the analog-to-digital converter 102, there is a case where analog-to-digital conversion characteristics significantly deteriorate and normal operation is not achieved.

Further, when package or a board connected to the semiconductor chip of the analog-to-digital conversion device 101 is changed, values of the parasitic inductors L1 to L4 of the package change, resulting in that the resonance frequency shifts. There is a possibility that a characteristic difference of the analog-to-digital converter 102 is generated depending on a type of the package, and this has to be prevented.

Now that development cost of SoC (System-on-a-chip) has been increasing more and more, it is common that one SoC is developed, and is applied to a plurality of packages after researching a plurality of markets. When a QFP (Quad Flat Package) package is used, values of inductors L1 to L4 become large, and when a BGA (Ball Grid Array) package is used, values of inductors L1 to L4 become small. It is preferably to design such that even when the QFP package is used, analog-to-digital conversion characteristics similar to those of the BGA package can be obtained. In order to realize that, there can be cited a task to make one SoC to be corresponded to a plurality of packages. Hereinafter, an embodiment for achieving the task will be described.

FIG. 2 is a diagram illustrating a configuration example of an analog-to-digital conversion device according to an embodiment. An analog-to-digital conversion device 201 is a large scale integration (LSI), and has a power supply potential node VDD, a reference potential node GND, a first reference potential node VREFP, a second reference potential node VREFM, a first input signal node VIP and a second input signal node VIM. The power supply potential node VDD supplies a power supply potential from an outside to an analog-to-digital converter 202. The reference potential node GND supplies a reference potential from an outside (ground potential, for example) to the analog-to-digital converter 202. The first reference potential node VREFP and the second reference potential node VREFM supply reference potentials for defining a full scale of the analog-to-digital converter 202 to the analog-to-digital converter 202. The first reference potential node VREFP is a reference potential node on a plus side, and the second reference potential node VREFM is a reference potential node on a minus side. To the first input signal node VIP and the second input signal node VIM, differential signals are input, for example. The first input signal node VIP is an input signal node on a plus side, and the second input signal node VIM is an input signal node on a minus side. The analog-to-digital converter 202 converts a signal based on signals of the first input signal node VIP and the second input signal node VIM from analog to digital, and outputs a digital signal DT to a digital circuit 203. The digital circuit 203 outputs an enable signal EN and a control signal CTL to the analog-to-digital converter 202. The control signal CTL includes a clock signal.

As described a above, when a switch included in the analog-to-digital converter 202 is switched at high speed, a noise is generated, and the noise causes a variation in electric potentials of the power supply potential node VDD, the reference potential node GND, the first reference potential node VREFP and the second reference potential node VREFM, resulting to that an analog-to-digital conversion performance of the an analog-to-digital converter 202 is deteriorated. In order to reduce the noise, variable capacitors VC1 and VC2 called as decoupling capacitors are provided. The capacitor VC1 is connected between the power supply potential node VDD and the reference potential node GND. The capacitor VC2 is connected between the first reference potential node VREFP and the second reference potential node VREFM. The capacitors VC1 and VC2 operate to supply an amount of sudden current change needed by the above-described switching operation from electric charges stored in the capacitors VC1 and VC2. The capacitor VC1 can reduce the noise on the power supply potential node VDD and the reference potential node GND. The capacitor VC2 can reduce the noise on the first reference potential node VREFP and the second reference potential node VREFM. It is desirable to use the capacitors VC1 and VC2 which can supply electric charges at high speed. Further, the larger the capacitance values of the capacitors VC1 and VC2 are, the more the noise can be reduced. Further, it is desirable to dispose the capacitors VC1 and VC2 in the vicinity of the analog-to-digital converter 202 being a source of the noise. In order to realize that, it is preferable to dispose the capacitors VC1 and VC2 in the large scale integration of the analog-to-digital conversion device 201.

The large scale integration of the analog-to-digital conversion device 201 is mounted on a package through wire bonding or the like. Inductors L1 to L4 are parasitic inductances due to a connection with the package, and are, for example, parasitic inductors due to a bonding wire or the like for connecting a silicon substrate of the analog-to-digital conversion device 201 and an external circuit. The inductor L1 is a parasitic inductor connected to the power supply potential node VDD. The inductor L2 is a parasitic inductor connected to the first reference potential node VREFP. The inductor L3 is a parasitic inductor connected to the second reference potential node VREFM. The inductor L4 is a parasitic inductor connected to the reference potential node GND.

Due to a series connection circuit of the capacitors VC1 and VC2 and the inductors L1 to L4, there is a case where a resonance occurs. A resonance frequency is determined by values of the capacitors VC1 and VC2 and the inductors L1 to L4. In particular, when the resonance frequency is close to an operating frequency or a signal band of the analog-to-digital converter 202, there is a case where analog-to-digital conversion characteristics significantly deteriorate and normal operation is not achieved. Accordingly, by controlling the values of the variable capacitors VC1 and VC2, the resonance frequency is shifted, to thereby prevent the deterioration of analog-to-digital conversion characteristics.

A variable resistor VR1 is connected between the power supply potential node VDD and a power supply potential node of the analog-to-digital converter 202. A variable resistor VR2 is connected between the first reference potential node VREFP and a first reference potential node of the analog-to-digital converter 202. A variable resistor VR3 is connected between the second reference potential node VREFM and a second reference potential node of the analog-to-digital converter 202. A variable resistor VR4 is connected between the reference potential node GND and a reference potential node of the analog-to-digital converter 202. By controlling values of the variable resistors VR1 to VR4, it is possible to reduce an influence of the resonance. However, if the values of the variable resistors VR1 to VR4 are increased too much, a voltage drop of the circuit is increased and the decoupling effect of the capacitors VC1 and VC2 is reduced, so that it is preferably to control the values of the variable resistors VR1 to VR4 to appropriate values.

In order to control the values of the variable capacitors VC1 and VC2 and the variable resistors VR1 to VR4, there are provided a switch SW1, a monitor circuit 204, a judgment circuit 205 and a control signal generating circuit 206. The switch SW1 is connected between the first input signal node VIP and the second input signal node VIM.

Figure 3:
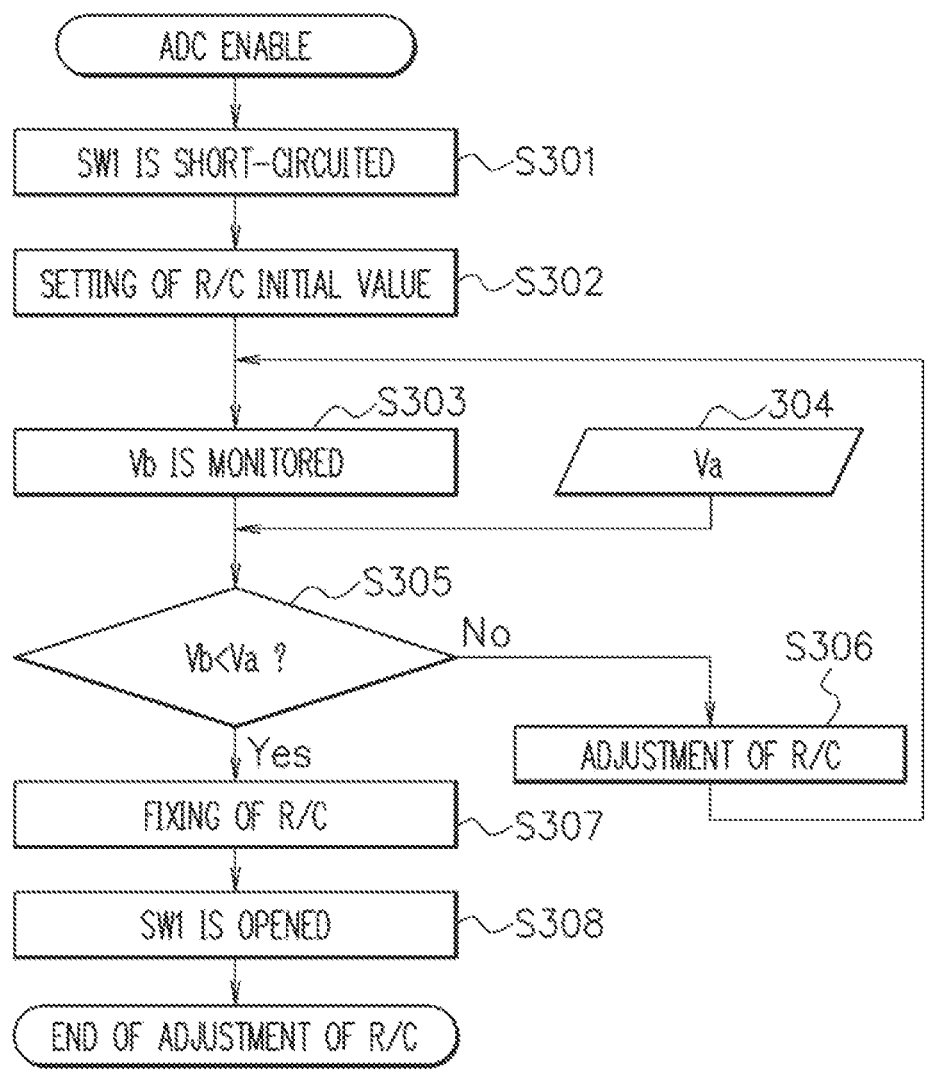
FIG. 3 is a flow chart for explaining an operation of the analog-to-digital conversion device in FIG. 2.

FIG. 3 is a flow chart for explaining an operation of the analog-to-digital conversion device in FIG. 2. The digital circuit 203 changes a level of the enable signal EN from a low level to a high level to cause the analog-to-digital converter 202 to be in an enabled state, and outputs the enable signal EN to the analog-to-digital converter 202 and the monitor circuit 204. Accordingly, a state of the analog-to-digital converter 202 becomes an operable state from a power-down state.

In step S301, when the monitor circuit 204 receives an input of a high-level enable signal EN, it sets a level of a control signal As of the switch SW1 to a high level. Accordingly, the switch SW1 is turned on (short-circuited), and the first input signal node VIP and the second input signal node VIM are connected to each other. As a result of this, both of voltages of the first input signal node VIP and the second input signal node VIM take a fixed value of common voltage. The common voltage corresponds to a level of center value in an input signal range. The analog-to-digital converter 202 receives an input of a signal of the common voltage from the first input signal node VIP and the second input signal node VIM, converts a signal based on the input signal from analog to digital, and outputs a digital signal DT. The digital signal DT corresponds to the above-described common voltage, and has a level of substantially a center value in an output signal range. For example, when the digital signal DT can express 10 bits and 1024 values, the digital signal DT takes "512" being a center value. However, when the resonance frequency determined by the values of the capacitors VC1 and VC2 and the inductors L1 to L4 is in the vicinity of the operating frequency of the analog-to-digital converter 202, the resonance occurs, resulting in that a deviation occurs in the value of the digital signal DT.

Next, in step S302, the control signal generating circuit 206 outputs a resistance control signal Ar of initial value to the variable resistors VR1 to VR4, and outputs a capacitance control signal Ac of initial value to the variable capacitors VC1 and VC2. Accordingly, the values of the variable resistors VR1 to VR4 are set to the initial value, and the values of the variable capacitors VC1 and VC2 are set to the initial value.

Next, in step S303, the monitor circuit 204 detects a deviation amount Vb being an amount of deviation of the digital signal DT converted by the analog-to-digital converter 202 with respect to an expected value, and outputs the deviation amount Vb to the judgment circuit 205. Here, the expected value is the aforementioned center value of "512", for example. The deviation amount Vb is an absolute value of a difference between the digital signal DT and the expected value.

Next, in step S305, the judgment circuit 205 checks whether or not the deviation amount Vb is smaller than a threshold value Va in a memory 304. If the deviation amount Vb is smaller than the threshold value Va, the process proceeds to step S307, and if the deviation amount Vb is equal to or larger than the threshold value Va, the process proceeds to step S306. When the resonance frequency determined by the values of the capacitors VC1 and VC2 and the inductors L1 to L4 is in the vicinity of the operating frequency of the analog-to-digital converter 202, the deviation amount Vb becomes large, and when the resonance frequency determined by the values of the capacitors VC1 and VC2 and the inductors L1 to L4 is sufficiently deviated from the operating frequency of the analog-to-digital converter 202, the deviation amount Vb becomes small.

In step S306, in order to change the values of the variable resistors VR1 to VR4 and the variable capacitors VC1 and VC2 in a direction where the deviation amount Vb becomes small, the control signal generating circuit 206 outputs the resistance control signal Ar and the capacitance control signal Ac. Accordingly, the values of the variable resistors VR1 to VR4 and the variable capacitors VC1 and VC2 are changed. By increasing the values of the variable resistors VR1 to VR4, it is possible to reduce the influence of the resonance to reduce the deviation amount Vb. Further, by changing the values of the variable capacitors VC1 and VC2, the resonance frequency shifts, resulting in that the deviation amount Vb can be reduced. After that, the process returns to the processing in step S303. By repeating this loop processing, the deviation amount Vb becomes small. Before long, when the deviation amount Vb becomes smaller than the threshold value Va, the process proceeds to step S307.

In step S307, the control signal generating circuit 206 fixes the values of the variable resistors VR1 to VR4 and the variable capacitors VC1 and VC2, using the resistance control signal Ar and the capacitance control signal Ac.

Next, instep S308, the monitor circuit 204 outputs a low-level switch control signal As to the switch SW1. Accordingly, the switch SW1 turned off (opened). This is the end of the adjustment of the values of the variable resistors VR1 to VR4 and the variable capacitors VC1 and VC2. After that, the analog-to-digital converter 202 performs normal analog-to-digital conversion by inputting signals into the first input signal node VIP and the second input signal node VIM.

Figure 4:
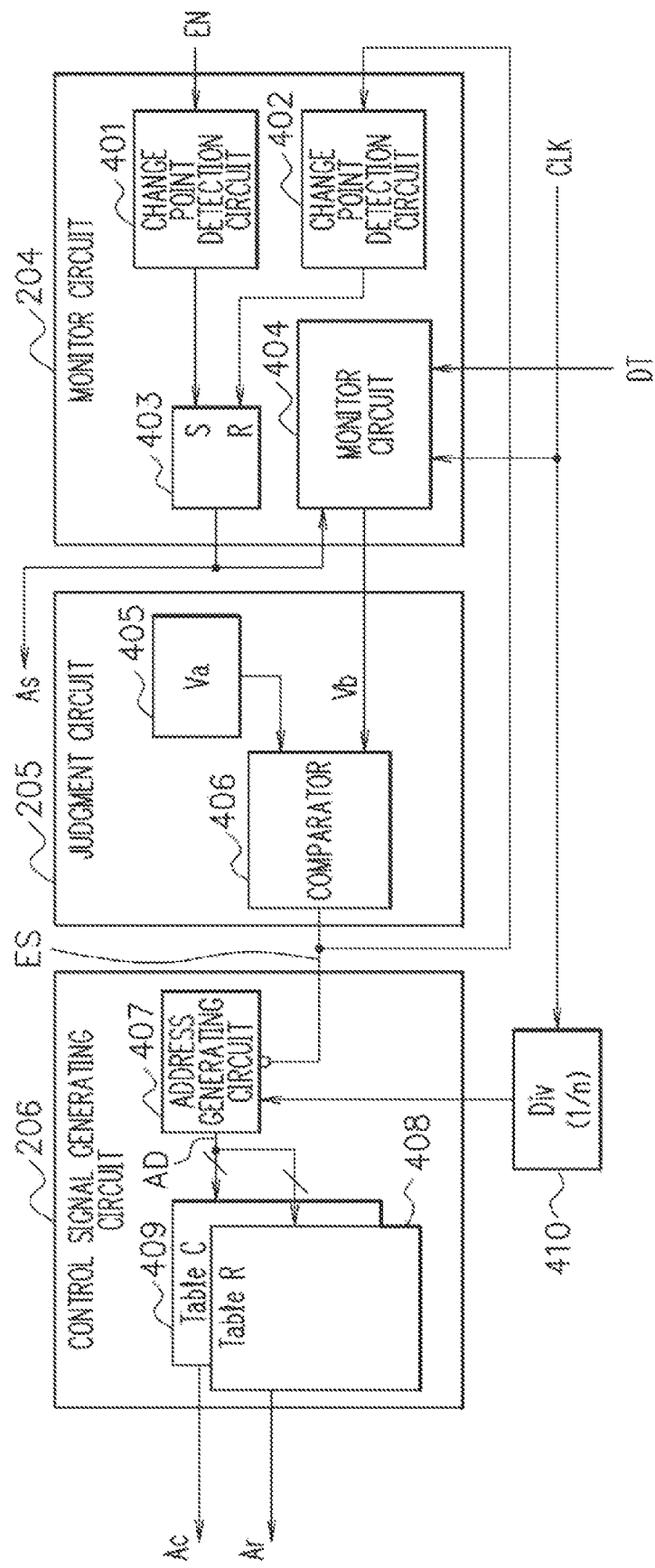
FIG. 4 is a diagram illustrating a configuration example of a monitor circuit, a judgment circuit and a control signal generating circuit in FIG. 2.

FIG. 4 is a diagram illustrating a configuration example of the monitor circuit 204, the judgment circuit 205 and the control signal generating circuit 206 in FIG. 2, and FIG. 5 is a timing chart illustrating an example of operation of the circuits in FIG. 4. A clock signal CLK is a sampling clock signal of the analog-to-digital converter 202, and is input from the digital circuit 203. A frequency divider 410 divides a frequency of the clock signal CLK into n, and outputs the resultant to an address generating circuit 407. Here, n is 8, for example. The digital circuit 203 changes a level of the enable signal EN from a low level to a high level to cause the analog-to-digital converter 202 to be in an enabled state.

At a time t1, when the level of the enable signal EN is changed from a low level to a high level, a change point detection circuit 401 outputs a high-level signal to a set terminal of a set-reset circuit 403 in synchronization with a rising edge of the clock signal CLK. Accordingly, the set-reset circuit 403 outputs a high-level switch control signal As. As a result of this, the switch SW1 is turned on.

The address generating circuit 407 outputs an address AD of "1", as an initial value. A resistance table 408 outputs a resistance control signal Ar of initial value based on the address AD of "1". Accordingly, the variable resistors VR1 to VR4 are set to have a resistance value of initial value. A capacitance table 409 outputs a capacitance control signal Ac of initial value based on the address AD of "1". Accordingly, the variable capacitors VC1 and VC2 are set to have a capacitance value of initial value.

When the monitor circuit 404 receives an input of a high-level switch control signal As, it detects, in synchronization with the clock signal CLK, an absolute value of a difference between a digital signal DT and an expected value as a deviation amount Vb1.

Next, at a time t2, the monitor circuit 404 calculates an average value Vb of, for example, seven deviation amounts Vb1, and outputs the average value Vb of deviation amount to a comparator 406.

Next, at a time t3, the comparator 406 compares the average value Vb of deviation amount and a threshold value Va in a memory 405. Here, the average value Vb of deviation amount is equal to or larger than the threshold value Va in the memory 405, so that the comparator 406 outputs a low-level comparison result signal ES. Accordingly, the address generating circuit 407 increments the address AD from "1" to "2", in synchronization with a rising edge of the clock signal output by the frequency divider 410. The resistance table 408 outputs a resistance control signal Ar based on the address AD of "2". Accordingly, the values of the variable resistors VR1 to VR4 are changed. The capacitance table 409 outputs a capacitance control signal Ac based on the address AD of "2". Accordingly, the values of the variable capacitors VC1 and VC2 are changed.

Since the switch control signal As is of a high level, the monitor circuit 404 detects, in synchronization with the clock signal CLK, and absolute value of a difference between the digital signal DT and the expected value as a deviation amount Vb1.

Next, at a time t4, the monitor circuit 404 calculates an average value Vb of, for example, seven deviation amounts Vb1, and Outputs the average value Vb of deviation amount to the comparator 406.

Next, at a time t5, the comparator 406 compares the average value Vb of deviation amount and the threshold value Va in the memory 405. Here, the average value Vb of deviation amount is equal to or larger than the threshold value Va in the memory 405, so that the comparator 406 outputs a low-level comparison result signal ES. Accordingly, the address generating circuit 407 increments the address AD from "2" to "3", in synchronization with a rising edge of the clock signal output by the frequency divider 410. The resistance table 408 outputs a resistance control signal Ar based on the address AD of "3". Accordingly, the values of the variable resistors VR1 to VR4 are changed. The capacitance table 409 outputs a capacitance control signal Ac based on the address AD of "3". Accordingly, the values of the variable capacitors VC1 and VC2 are changed.

Since the switch control signal As is of a high level, the monitor circuit 404 detects, in synchronization with the clock signal CLK, an absolute value of a difference between the digital signal DT and the expected value as a deviation amount Vb1.

Next, at a time t6, the monitor circuit 404 calculates an average value Vb of, for example, seven deviation amounts Vb1, and outputs the average value Vb of deviation amount to the comparator 406.

Next, at a time t7, the comparator 406 compares the average value Vb of deviation amount and the threshold value Va in the memory 405. Here, the average value Vb of deviation amount is smaller than the threshold value Va in the memory 405, so that the comparator 406 outputs a high-level comparison result signal ES. Accordingly, the address generating circuit 407 maintains the address AD of "3". As a result of this, the values of the variable resistors VR1 to VR4 and the variable capacitors VC1 and VC2 are fixed.

When the level of the comparison result signal ES is changed from a low level to a high level, a change point detection circuit 402 outputs a high-level signal to a reset terminal of the set-reset circuit 403. Accordingly, the set-reset circuit 403 outputs a low-level switch control signal As to the switch SW1 and the monitor circuit 404. As a result of this, the switch SW1 is turned off, and the monitor circuit 404 stops its operation. According to the above processing, it becomes possible to perform the analog-to-digital conversion in a state where the influence of resonance is reduced.

As described above, the judgment circuit 205 can judge whether or not the resonance state is established, by comparing the average value Vb of deviation amount and the threshold value Va. When the resonance state is established, the control signals Ac and Ar that simultaneously adjust the decoupling capacitors VC1 and VC2 and the wiring resistors VR1 to VR4, are generated. By turning on the switch SW1, the digital signal DT of the analog-to-digital converter 202 takes a center value (fixed value) with respect to the resolution of the analog-to-digital converter 202. However, if there is an influence of the resonance, the digital signal DT fluctuates since the power supply voltage is influenced by the fluctuation due to the resonance. When the monitor circuit 404 monitors the fluctuation of the digital signal DT, and gives feedback to the variable resistors VR1 to VR4 and the variable capacitors VC1 and VC2, it is possible to reduce the influence of the resonance by automatically adjusting the values of the decoupling capacitors VC1 and VC2 and the wiring resistors VR1 to VR4 to optimised values at the same time.

When a package or a board connected to a semiconductor chip of the analog-to-digital converter 202 is changed, values of parasitic inductors L1 to L4 of the package are changed, so that a resonance frequency shifts. According to the present embodiment, by controlling the values of the variable capacitors VC1 and VC2 and the variable resistors VR1 to VR4 baaed on the deviation amount Vb of the digital signal DT, it is possible to prevent the characteristic difference of the analog-to-digital converter 202 which is generated depending on a type of the package.

Further, the control circuits including the monitor circuit 204, the judgment circuit 205 and the control signal generating circuit 206 perform the proceeding based on the digital signal DT, so that the circuits can be formed of digital circuits. Note that in a case of an analog circuit, since the circuit uses a comparator or the like that needs a steady-state current, a consumption current increases, and thus it is not possible to fulfill the demands of low power consumption. The control circuits of the present embodiment are digital circuits, so that power consumption can be reduced.

Note that the above-described embodiment explains a case, as an example, in which the differential signals are input into the first input signal node VIP and the second input signal node VIM, but, it is also possible to input a single-ended signal. In such a case, the single-ended signal may be input into the first input signal node VIP, and the second input signal node VIM may be fixed to a common voltage. As a control method, one same as the above-described control method may be used. Further, the analog-to-digital converter 202 may also be one that performs analog-to-digital conversion on a signal of one input signal node. Further, the analog-to-digital conversion device 201 may also be one which does not have the first reference potential node VREFP and the second reference potential node VREFM. Further, the expected value may also be a fixed value other than the common voltage.

In such a case, the analog-to-digital converter 202 receives an input of a signal of the input signal node, and converts a signal based on the signal of the input signal node from analog to digital. The control circuits 204 to 206 receive an input of a digital signal DT converted by the analog-to-digital converter 202 when the signal of the input signal node is set to have a fixed value, and change, when a deviation amount Vb of the digital signal DT with respect to the expected value is equal to or larger than the threshold value Va, the value of the capacitor VC1 between the power supply potential node VDD and the reference potential node GND of the analog-to-digital converter 202, and/or the values of the resistors VR1 and VR4 connected to the power supply potential node VDD and the reference potential node GND of the analog-to-digital converter 202.

Further, when the first reference potential node VREFP and the second reference potential node VREFM exist, the control circuits 204 to 206 receive an input of a digital signal DT converted by the analog-to-digital converter 202 when the signal of the input signal node is set to have a fixed value, and change, when a deviation amount Vb of the digital signal DT with respect to the expected value is equal to or larger than the threshold value Va, the value of the capacitor VC2 between the first reference potential node VREFP and the second reference potential node VREFM, and/or the values of the resistors VR2 and VR3 connected to the first reference potential node VREFP and the second reference potential node VREFM.

According to the present embodiment, depending on a change in package or the like, values of parasitic inductances change, resulting in that a resonance frequency changes. In such a case, by providing the control circuits 204 to 206, it is possible to prevent a deterioration of analog-to-digital conversion characteristics.

Depending on a change in package or the like, values of parasitic inductances change, resulting in that a resonance frequency changes. In such a case, by providing the control circuits, it is possible to prevent a deterioration of analog-to-digital conversion characteristics.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analog-to-digital conversion device, comprising:
   an analog-to-digital converter configured to receive an input signal via an input signal node, and convert the input signal to a digital signal; and
   a control circuit configured to receive the digital signal when the input signal is set to have a fixed value, and change, when a deviation amount of the digital signal with respect to an expected value is equal to or larger than a threshold value, a value of a capacitor between a power supply potential node and a reference potential node of the analog-to-digital converter, or values of resistors connected to the power supply potential node and the reference potential node of the analog-to-digital converter, or any combination thereof.

2. The analog-to-digital conversion device according to claim 1, further comprising
   first and second reference potential nodes configured to supply reference potentials for defining a full scale of the analog-to-digital converter to the analog-to-digital converter, wherein
   the control circuit is configured to receive the digital signal when the input signal is set to have the fixed value, and change, when the deviation amount of the digital signal with respect to the expected value is equal to or larger than the threshold value, a value of a capacitor between the first and second reference potential nodes, or values of resistors connected to the first and second reference potential nodes, or any combination thereof.

3. The analog-to-digital conversion device according to claim 2, wherein
   the control circuit is configured to receive the digital signal when the input signal is set to have the fixed value, and change, when the deviation amount of the digital signal with respect to the expected value is equal to or larger than the threshold value, the values of the capacitor between the power supply potential node and the reference potential node of the analog-to-digital converter, the resistors connected to the power supply potential node and the reference potential node of the analog-to-digital converter, the capacitor between the first and second reference potential nodes, and the resistors connected to the first and second reference potential nodes.

4. The analog-to-digital conversion device according to claim 1, further comprising
   first and second reference potential nodes configured to supply reference potentials for defining a full scale of the analog-to-digital converter to the analog-to-digital converter, wherein
   when the deviation amount of the digital signal with respect to the expected value is smaller than the threshold value, the control circuit is configured to maintain the value of the capacitor between the first and second reference potential nodes, or the values of the resistors connected to the first and second reference potential nodes, or any combination thereof.

5. The analog-to-digital conversion device according to claim 1, wherein when an average value of the deviation amount is equal to or larger than the threshold value, the control circuit change the value of the capacitor between the power supply potential node and the reference potential node of the analog-to-digital converter, or the values of the resistors connected to the power supply potential node and the reference potential node of the analog-to-digital converter, or any combination thereof.

6. A analog-to-digital conversion device, comprising:
an analog-to-digital converter is configured to receive a first input signal via a first input signal node and a second input signal via a second input signal node, and convert the first and second input signals to a digital signal; and
a control circuit configured to receive the digital signal when the input signals are set to have a fixed value, and change, when a deviation amount of the digital signal with respect to an expected value is equal to or larger than a threshold value, a value of a capacitor between a power supply potential node and a reference potential node of the analog-to-digital converter, or values of resistors connected to the power supply potential node and the reference potential node of the analog-to-digital converter, or any combination thereof.

7. The analog-to-digital conversion device according to claim 6, further comprising
a switch configured to be coupled between the first input signal node and the second input signal node, wherein
the control circuit is configured to turn on the switch to set the first and second input signals to have the fixed value.

8. The analog-to-digital conversion device according to claim 7, further comprising
first and second reference potential nodes configured to supply reference potentials for defining a full scale of the analog-to-digital converter to the analog-to-digital converter, wherein
when the deviation amount of the digital signal with respect to the expected value is smaller than the threshold value, the control circuit maintain the value of the capacitor between the first and second reference potential nodes, or the values of the resistors connected to the first and second reference potential nodes, and turn off the switch, or any combination thereof.

9. The analog-to-digital conversion device according to claim 6, further comprising:
first and second reference potential nodes configured to supply reference potentials for defining a full scale of the analog-to-digital converter to the analog-to-digital converter,
wherein the control circuit is configured to receive the digital signal when the input signal is set to have the fixed value, and change, when the deviation amount of the digital signal with respect to the expected value is equal to or larger than the threshold value, a value of a capacitor between the first and second reference potential nodes, or values of resistors connected to the first and second reference potential nodes, or any combination thereof.

10. The analog-to-digital conversion device according to claim 6, wherein
the control circuit is configured to receive the digital signal when the input signal is set to have the fixed value, and change, when the deviation amount of the digital signal with respect to the expected value is equal to or larger than the threshold value, the values of the capacitor between the power supply potential node and the reference potential node of the analog-to-digital converter, the resistors connected to the power supply potential node and the reference potential node of the analog-to-digital converter, the capacitor between the first and second reference potential nodes, and the resistors connected to the first and second reference potential nodes.

11. The analog-to-digital conversion device according to claim 6, further comprising
first and second reference potential nodes configured to supply reference potentials for defining a full scale of the analog-to-digital converter to the analog-to-digital converter,
wherein when the deviation amount of the digital signal with respect to the expected value is smaller than the threshold value, the control circuit is configured to maintain the value of the capacitor between the first and second reference potential nodes, or the values of the resistors connected to the first and second reference potential nodes, or any combination thereof.

12. The analog-to-digital conversion device according to claim 6,
wherein when an average value of the deviation amount is equal to or larger than the threshold value, the control circuit change the value of the capacitor between the power supply potential node and the reference potential node of the analog-to-digital converter, or the values of the resistors connected to the power supply potential node and the reference potential node of the analog-to-digital converter, or any combination thereof.

* * * * *